(12) United States Patent
Hamm

(10) Patent No.: US 8,217,292 B2
(45) Date of Patent: Jul. 10, 2012

(54) OPERATING DEVICE FOR AN ELECTRICAL APPLIANCE

(75) Inventor: Wolfgang Alfred Hamm, Bretten (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 248 days.

(21) Appl. No.: 12/690,523

(22) Filed: Jan. 20, 2010

(65) Prior Publication Data

US 2010/0181181 A1   Jul. 22, 2010

(30) Foreign Application Priority Data

Jan. 22, 2009  (DE) .................. 10 2009 006 421

(51) Int. Cl.
*H03K 17/955* (2006.01)
(52) U.S. Cl. ........................................ 200/600
(58) Field of Classification Search .............. 200/600, 200/339
See application file for complete search history.

(56) References Cited

U.S. PATENT DOCUMENTS

| | | | | |
|---|---|---|---|---|
| 4,413,252 A * | 11/1983 | Tyler et al. | ...... | 200/5 A |
| 5,594,222 A | 1/1997 | Caldwell | | |
| 6,224,221 B1 * | 5/2001 | Glienicke | ...... | 362/23 |
| 6,410,866 B1 | 6/2002 | Klein et al. | | |
| 7,884,299 B2 * | 2/2011 | Glew | ...... | 200/600 |
| 2002/0112942 A1 * | 8/2002 | Galmiche et al. | ...... | 200/600 |
| 2003/0193013 A1 * | 10/2003 | Balp et al. | ...... | 250/221 |
| 2005/0067268 A1 * | 3/2005 | Hurrle | ...... | 200/314 |
| 2005/0207172 A1 * | 9/2005 | Orth | ...... | 362/395 |
| 2007/0095644 A1 * | 5/2007 | Akieda et al. | ...... | 200/531 |
| 2007/0181410 A1 | 8/2007 | Baier | | |
| 2008/0067052 A1 * | 3/2008 | Glew | ...... | 200/600 |
| 2008/0110739 A1 * | 5/2008 | Peng et al. | ...... | 200/5 R |
| 2008/0111428 A1 | 5/2008 | Baier et al. | | |
| 2008/0237024 A1 * | 10/2008 | Millet | ...... | 200/600 |
| 2009/0009491 A1 * | 1/2009 | Grivna | ...... | 345/184 |
| 2009/0107829 A1 * | 4/2009 | Heimann | ...... | 200/600 |

FOREIGN PATENT DOCUMENTS

| | | |
|---|---|---|
| DE | 37 02 291 A1 | 8/1988 |
| DE | 10 2004 026 836 A1 | 12/2005 |
| DE | 10 2006 039 196 B3 | 10/2007 |
| DE | 20 2006 006 509 U1 | 10/2007 |
| WO | WO 2005/019766 A2 | 3/2005 |

OTHER PUBLICATIONS

European Search Report dated Mar. 4, 2011 in corresponding European Patent Application No. 09 01 5415.4.
German Office Action for German Application No. 10 2009 006 421.4, Aug. 11, 2009.

* cited by examiner

*Primary Examiner* — Briggitte R Hammond
(74) *Attorney, Agent, or Firm* — Alston & Bird LLP

(57) ABSTRACT

An operating device for an electrical appliance comprises a control panel and an operating element arranged in the control panel for operation by rotary actuation. The operating element is mounted in a cup-like receptacle, at least one additional touch-sensitive switch being arranged in a region of the control panel adjacent to or around the operating element. Advantageously, this is a capacitive touch-sensitive switch with a capacitive sensor element.

9 Claims, 2 Drawing Sheets

OPERATING DEVICE FOR AN ELECTRICAL APPLIANCE

CROSS REFERENCE TO RELATED APPLICATIONS

This application claims priority to German Application Number 10 2009 006 421.4, filed on Jan. 22, 2009, the contents of which are incorporated by reference.

FIELD OF THE INVENTION

The invention relates to an operating device for an electrical appliance.

BACKGROUND OF THE INVENTION

Operating devices for electrical appliances are known in many and diverse forms. In such cases, receptacles are most frequently arranged on or behind a control panel, as is known for example from EP 1 318 534 A1, in which an operating element, such as for example a rotary knob, is mounted. This rotary knob may also be recessable. Behind the receptacle is arranged a rotary switching device, which is operated by means of the rotary knob. It may be desirable for it to be possible to trigger further functions with the operating device in addition to such actuation by rotation. Auxiliary switches or the like may be provided, for example. One option for constructing such auxiliary switches on a rotary knob itself is known for example from US 2007/0181410 A1.

SUMMARY

A problem underlying the present invention is that of providing an operating device as stated above which comprises further functions and with which it is advantageously possible to extend the operating functionality of the operating device.

This problem is solved in various embodiments by an operating device having the features as claimed herein. Advantageous and preferred configurations of the invention are the subject matter of the further claims and are explained in greater detail below. The wording of the claims is incorporated by express reference into the content of the description.

Provision may be made for the operating device to comprise an operating element for operation by rotary actuation, in particular a rotary knob. The operating element is arranged in the control panel, it being mounted in this respect in a cup-like receptacle. According to one embodiment of the invention, at least one additional touch-sensitive switch is provided in an area in the control panel close to the operating element or around the operating element. In particular, this touch-sensitive switch directly adjoins the operating element or is only separated there from by a narrow fitting gap.

It is thus possible for power settings or operating times, for example, to be adjusted by the rotatable operating element, i.e., for numerical values to be changed. These then apply once adjustment is concluded, or alternatively a signal may be produced as actuating a signal precisely by way of an additional touch-sensitive switch. Moreover rotary actuations may ensure spatial assignment by, for example, a setting mark on the operating element, to one of a plurality of touch-sensitive switches arranged in a ring around the operating element, said spatial assignment then being actuated as an actuation signal. Numerous further options for operating methods are provided and are readily conceivable.

In one embodiment of the invention, the touch-sensitive switch may advantageously be a capacitive touch-sensitive switch. To this end, it may comprise an electrically conductive capacitive sensor element. This sensor element is particularly advantageously electrically insulated on the outside or on the front of the control panel, where it is arranged. This therefore means that it is electrically insulated with regard to contact by an operator and safety regulations are thus also observed.

In a further embodiment of the invention, the receptacle may comprise a collar-like portion, which extends approximately parallel to the control panel and around the operating element. A touch-sensitive switch or a sensor element therefore may be arranged on this collar-like portion and, for example, attached thereto. This will be addressed in more detail below. In particular, provision may be made for the collar-like portion of the receptacle to cover the touch-sensitive switch or the sensor element. The above-stated electrical insulation may then also be very readily achieved. A contact surface of the touch-sensitive switch is then formed by the portion of the receptacle, such that no complex work has to be carried out on the panel, or such that the design and/or the operating functions may be varied with the same panel by varying the operating device.

In one embodiment of the invention, it is possible to produce the sensor element, which is advantageously of flat construction, as a coating. Such a coating of electrically conductive material may advantageously be provided on an area of the receptacle, which extends parallel to the control panel. In particular, this is the above-stated collar-like portion, on the back of which the sensor elements are then applied by corresponding coating.

In an alternative embodiment of the invention, provision may be made for a sensor element to be made of flat material, advantageously as a flat metal plate. Such a metal plate may be attached by adhesively bonding, for example, as a separate part to the control panel itself or the receptacle. Here too, one suitable option is for such a sensor element to be attached as a separate part to the receptacle or the above-stated collar-like portion, similarly to the coating. This also ensures that the sensor elements are arranged in precisely predetermined spatial assignment to the operating device.

In a further embodiment of the invention, an electrical supply lead or connector to the touch-sensitive switches or to the sensor elements thereof may be integrated into the receptacle. To this end too, the receptacle is arranged behind the control panel and, for example, comprises a switching device actuatable by rotary actuation by means of the operating element, which switching device is attached to a rear end of the receptacle.

It is possible to integrate an electrical supply lead or connector into the receptacle in such a way that it is provided as an electrically conductive coating on a surface of the receptacle. This is particularly advantageously possible on the outside of the receptacle. The coating may be provided by a thick layer paste or the like, or alternatively by plastics, into which particles are admixed for electrical conductivity. As an alternative to a coating, an electrical supply lead or connector may be achieved by very thin electrical conductors, which consist of, for example, very thin copper strips and are adhesively bonded to the receptacle. As a still further configuration of the invention, as an alternative, an electrical supply lead or connector may be injection molded as a type of conductor wire or the like into a receptacle, which conventionally consists of plastics. Electrically conductive plastics may also be injection molded as an electrical supply lead by two-component injection molding.

In general, both sensor elements and electrical supply leads or connections may be also applied using MID (Molded Interconnect Devices) technology. This is a novel method, in which a conductor layout is applied to three-dimensionally shaped supports, such as the receptacle in this case, in the form of a structured metal layer.

In the case of the electrical supply lead in the form of a coating, provision may be made for this to be guided on the outside of the receptacle to the stated collar-like portion and to extend there over. Such a coating may in itself form a "capacitive" sensor element if it is applied extensively. Alternatively, a sensor element in the form of a metal plate may in particular be placed thereon and adhesively bonded in place, in particular with conductive adhesive, for an electrical connection. This then corresponds to the previously described applied thin conductors of for example thin copper sheet or the like.

By means of the stated electrical supply lead or connector, an electrical connection is advantageously provided to a switching device arranged at the rear end of the receptacle. It is thus possible to provide an electrical connection for the touch-sensitive switch on the switching device, for example, in a similar manner to electrical connections to the switching device itself. In this way, it is possible for example to use identical plugs, such as group plugs or the like. In any case, the electrical connections are then very quickly and clearly recognizable. As an alternative, a separate cable may be led away from the supply lead or connector to form an electrical connection.

In an advantageous further embodiment of the invention, as has been claimed above, a plurality of additional touch-sensitive switches are provided on the control panel and distributed around the operating element. They may particularly advantageously be identical in size and evenly distributed. Provision is here advantageously made for a separate electrical supply lead or connector to be provided with a separate electrical terminal for each separate touch-sensitive switch or the above-stated sensor element thereof. It is thus possible, for example, for four to twelve such sensor elements to be provided.

In a further configuration of the invention, a display may be provided on the control panel around the operating element. This may be, for example, an LED or OLED display, which may also in each case be differently activated. Electrical activation or an activation state of such a display may proceed in a similar manner for the stated touch-sensitive switches or sensor elements.

These and further features follow not only from the claims but also from the description and the drawings, the individual features being realized in each case alone or several together in the form of sub-combinations in an embodiment of the invention and in other fields and may constitute advantageous, per se protectable embodiments, for which protection is here claimed. Subdivision of the application into individual sections and intermediate headings does not limit the general applicability of the statements made thereunder.

BRIEF DESCRIPTION OF THE DRAWINGS

Exemplary embodiments of the invention are illustrated schematically in the drawings and explained in more detail below. In the drawings.

DETAILED DESCRIPTION

Figure 1:
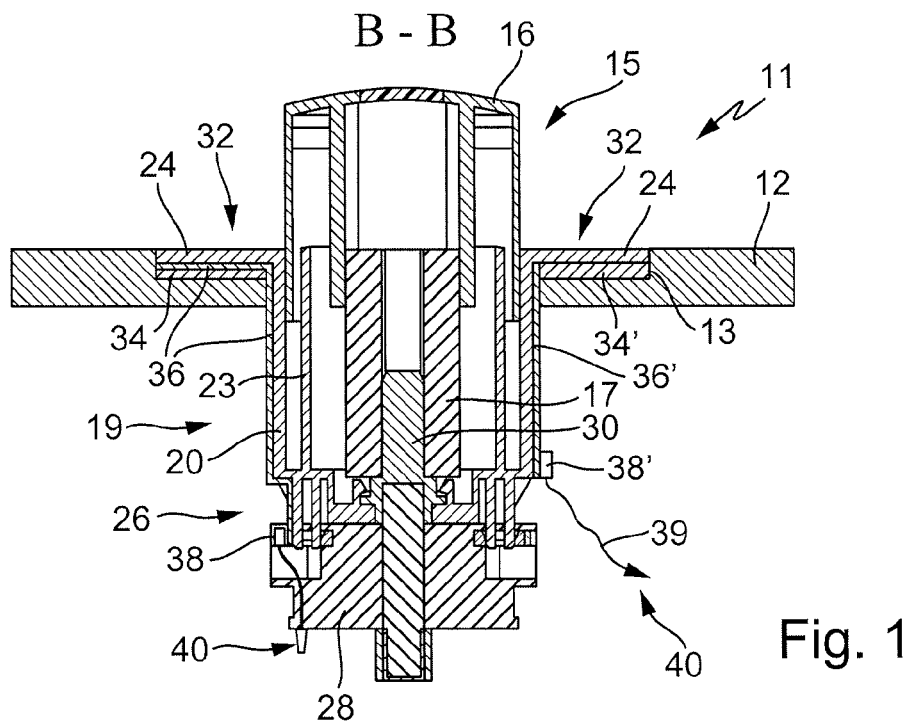
FIG. 1 shows a section through an operating device according to the invention with extended rotary knob and sensor elements.
Figure 2:
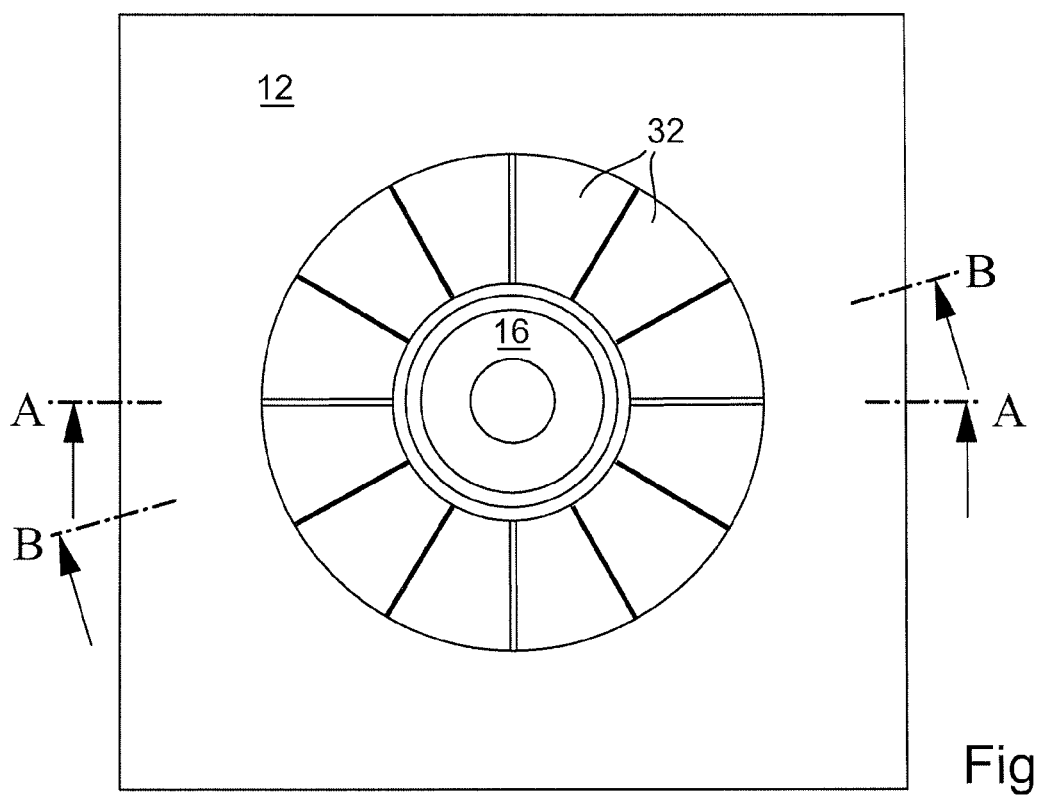
FIG. 2 shows a plan view of the operating device of FIG. 1 with the plurality of annularly arranged touch-sensitive switches and FIG. 3 shows a side view of the operating device of FIG. 1.

FIG. 1 shows, as per section B-B of FIG. 2, an operating device 11 according to the invention, which is mounted on a control panel 12 of an electrical appliance, not shown in any greater detail, in a cut-out 13 in which the operating device 11 is seated flushly. For rotary actuation it comprises a rotary knob 15, which consists of a front grip part 16 and a base part 17 configured as a bearing arrangement. The grip part 16 and base part 17 are connected in such a way that the rotary knob 15 takes the form of a recessed rotary knob. This is known for example from EP 1 318 534 A1, to which express reference is made, such that no further explanation needs to be provided here.

The rotary knob 15 extends in a receiving cup 19, which comprises an outer shell 20, advantageously in the form of a tubular portion, and an inner shell 23 connected directly therewith. The grip part 16 of the rotary knob 15 may engage in the interspace between inner shell 23 and outer shell 20 when recessed. At the front the outer shell 20 develops into a collar-like portion 24, the portion 24 projecting approximately at right angles to the longitudinal extent of the outer shell 20. This may also be seen very clearly from the plan view of FIG. 2.

At the rear end 26 of the receiving cup 19 a rotary switching device 28 is provided, which may be adjusted with the rotary knob 15. To this end, it is connected to the base part 17 via an axle stub 30, which is mounted at the rear end 26 of the receiving cup 19.

Touch-sensitive switches 32 are provided at the front or on the control panel 12, as shown in particular in FIG. 2, twelve items being distributed annularly around the rotary knob 15. The touch-sensitive switches 32 are delimited clearly from one another by separating webs. They take the form of capacitive touch-sensitive switches and to this end comprise capacitive sensor elements 34. On the left in FIG. 1 a capacitive sensor element 34 is configured as a correspondingly shaped metal plate and attached, in particular firmly adhesively bonded to the backwards pointing side of the collar-like portion 24. For electrical contacting of the sensor element 34 an electrical supply lead 36 is provided, which is fitted to the outside of the outer shell 20, either as an electrically conductive coating or of an adhesively bonded, web-form conductor material. The electrical supply lead 36 covers the entire rear surface of the collar-like portion 24 with the contour of the sensor element 34 and rests thereon or is connected electrically therewith. The electrical supply lead 36 extends towards the rear end 26, always on the surface of the outside of the outer shell 20. By means of a contacting means 38, for example, adhesively bonded with conductive adhesive, and a cable or the like, it is joined to a terminal plug 40 on the bottom of the rotary switching device 28 or connected thereto. By plugging on a correspondingly suitable plug connector, the capacitive sensor element 34 is activatable and evaluatable.

As an alternative to a capacitance based operating touch-sensitive switch, a miniature reflection light barrier could be used, to detect the application of a user's finger. This is then arranged instead of the sensor element 34 under the collar-like portion 24 and is activated by way of corresponding electrical connections, but in this case the connections are markedly more complex.

On the right in FIG. 1 an alternative configuration is shown. A touch-sensitive switch 32 is also provided therein, for actuation of which an operator lays their finger on the touch-sensitive switch 32 or the top of the collar-like portion 24 at this point. A capacitive sensor element 34' is here provided on the bottom of the collar-like portion 24, which sensor element takes the form of a coating and not of a separate part like the sensor element 34. This coating is connected directly to an electrical supply lead 36', which, as described above, may on the one hand be a coating and on the other hand a separate conductor. A short distance before the rear end 26 of the receptacle of the receiving cup 19, the supply lead 36' is provided with a contacting means 38', which leads via a cable 39 to a terminal plug 40. In this case, therefore, the terminal plug 40 is not provided on the rotary switching device 28.

Figure 3:
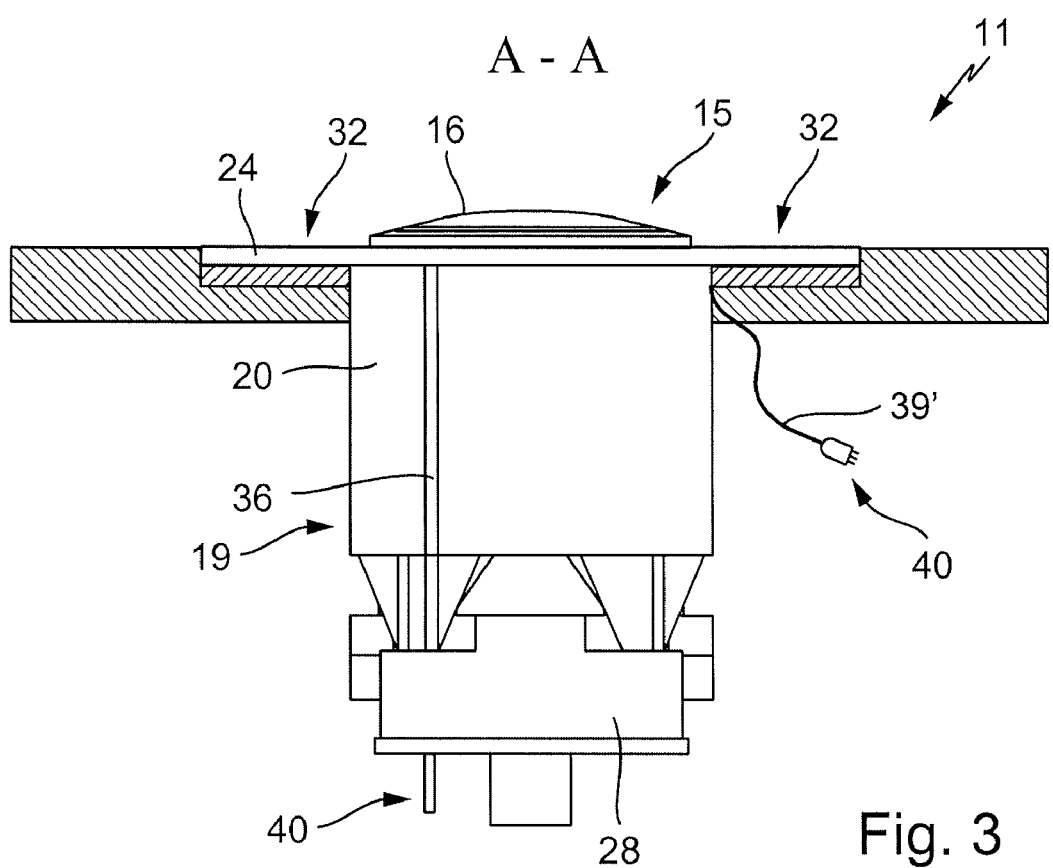

It is clear from the further illustration in FIG. 3, which is section A-A according to FIG. 2, how wide an electrical supply lead 36 shown in section in FIG. 1 may be, for example, and how it extends over the outside of the outer shell 20. It then develops into a terminal plug 40 at the bottom of the rotary switching device 28.

FIG. 3 also shows, merely as an alternative, a schematic connection via a cable 39' to a sensor element 34 of a capacitive touch-sensitive switch 32. It may in particular be possible, in the case of such separate or loose cables, for a single multiple plug-in connection to be provided for all the sensor elements 34.

In a further configuration of the invention it is possible, as is known from the simultaneously filed German patent application DE 102009006434.6 lodged at the same priority date by the same applicant, for the receiving cup 19, in particular the outer shell 20, to consist at least partially of light-conducting material. In the case of light irradiation from behind, for example with an LED onto the rotary switching device 28, lighting effects may be brought about at the front at the collar-like portion 24.

An electrically conductive coating on the receiving cup 19, whether on the rear of the collar-like portion 24 or the outside of the outer shell 20, may proceed for example by a printing process, in particular pad printing.

It is also clear from FIG. 2 that capacitive overcoupling on application of a finger may be detected by activation of two neighboring sensor elements. This is an alternative capacitive detection method.

The invention claimed is:

1. An operating device for an electrical appliance comprising:
    a control panel and an operating element arranged in said control panel for operation by rotary actuation, said operating element being mounted in a cup-like receptacle, wherein at least one additional touch-sensitive switch is arranged in a region of said control panel adjacent to said operating element or around said operating element, and
    wherein said touch-sensitive switch is a capacitive touch-sensitive switch with an electrically conductive capacitive sensor element,
    wherein an electrical supply lead is incorporated into said receptacle of said operating element as a connection to said touch-sensitive switch or said electrically conductive sensor element thereof, said receptacle being arranged behind said control panel and bearing at a rear end a switching device actuatable with said operating element by rotary actuation.

2. The operating device as claimed in claim 1, wherein said electrically conductive capacitive sensor element is electrically insulated on an outside or on a front of said control panel.

3. The operating device as claimed in claim 1, wherein said electrically conductive sensor element is made up of flat material and is attached as a separate part to said control panel or to said receptacle.

4. The operating device as claimed in claim 1, wherein an electrical supply lead or connector is provided as an electrically conductive coating on a surface of said receptacle.

5. The operating device as claimed in claim 1, wherein an electrical connection from said electrical supply lead or connector on said receptacle to an operating element switching device arranged at said rear end of said receptacle is provided for electrical connection of said touch-sensitive switch to said rear end of said switching device.

6. The operating device as claimed in claim 1, wherein a plurality of additional touch-sensitive switches are provided on said control panel around said operating element, a separate electrical supply lead or connector with a separate terminal being provided for each separate touch-sensitive switch.

7. The operating device as claimed in claim 1, wherein said operating device is inserted into said control panel of said electrical appliance.

8. The operating device as claimed in claim 1, wherein said touch-sensitive switch or said electrically conductive capacitive sensor element thereof is arranged on a collar-like portion of said receptacle around said operating element.

9. The operating device as claimed in claim 8, wherein said collar-like portion covers said touch-sensitive switch or said electrically conductive capacitive sensor element of said touch-sensitive switch.

* * * * *